(12) United States Patent
Habu et al.

(10) Patent No.: US 12,512,834 B2
(45) Date of Patent: Dec. 30, 2025

(54) SEMICONDUCTOR DEVICE

(71) Applicant: Mitsubishi Electric Corporation, Tokyo (JP)

(72) Inventors: Yo Habu, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 207 days.

(21) Appl. No.: 17/736,514

(22) Filed: May 4, 2022

(65) Prior Publication Data
US 2023/0137944 A1    May 4, 2023

(30) Foreign Application Priority Data

Nov. 4, 2021   (JP) .................................. 2021-180384

(51) Int. Cl.
*H03K 17/567* (2006.01)
*H02M 1/088* (2006.01)
*H02M 7/537* (2006.01)
*H03K 17/687* (2006.01)

(52) U.S. Cl.
CPC .......... *H03K 17/567* (2013.01); *H02M 1/088* (2013.01); *H02M 7/537* (2013.01); *H03K 17/6871* (2013.01)

(58) Field of Classification Search
CPC . H03K 17/567; H03K 17/6871; H02M 1/088; H02M 7/537
See application file for complete search history.

(56) References Cited

U.S. PATENT DOCUMENTS

| 6,172,493 | B1 | 1/2001 | Grant |
| 6,201,717 | B1 | 3/2001 | Grant |
| 8,502,571 | B2* | 8/2013 | Sasaki ...................... H03K 5/19 |
| | | | 327/108 |
| 8,970,185 | B1 | 3/2015 | Sutardja et al. |
| 9,448,574 | B2* | 9/2016 | Motz ....................... G05F 1/575 |
| 2005/0102128 | A1* | 5/2005 | Wilhelm ............ H03K 17/6871 |
| | | | 703/23 |
| 2011/0199710 | A1 | 8/2011 | Hano |

(Continued)

FOREIGN PATENT DOCUMENTS

| DE | 10 2015 221 223 A1 | 3/2017 |
| JP | S63-000541 U | 1/1988 |

(Continued)

OTHER PUBLICATIONS

An Office Action issued by the German Patent and Trademark Office on Jan. 24, 2025, which corresponds to German Patent Application No. 102022114891.2 and is related to U.S. Appl. No. 17/736,514; with English language translation.

(Continued)

*Primary Examiner* — Metasebia T Retebo
(74) *Attorney, Agent, or Firm* — Studebaker Brackett PLLC

(57) ABSTRACT

A semiconductor device includes: a P-side driving circuit and an N-side driving circuit respectively driving a P-side switching device and an N-side switching device which are connected to configure a half bridge; and a N-side power supply generation circuit generating a power supply voltage for the N-side driving circuit from a power supply voltage for the P-side switching device.

2 Claims, 8 Drawing Sheets

(56) References Cited

U.S. PATENT DOCUMENTS

| | | | |
|---|---|---|---|
| 2013/0063123 A1* | 3/2013 | Liang .................. | H03K 17/687 |
| | | | 323/313 |
| 2014/0266323 A1 | 9/2014 | McIntosh et al. | |
| 2016/0141965 A1 | 5/2016 | Hasegawa et al. | |
| 2017/0070147 A1 | 3/2017 | Childs | |
| 2018/0183437 A1* | 6/2018 | Mukhopadhyay ........ | G05F 1/46 |
| 2019/0097542 A1* | 3/2019 | Op Het Veld ...... | H02M 3/3378 |
| 2021/0013808 A1* | 1/2021 | Cattani ............... | H02M 1/0006 |
| 2021/0152075 A1* | 5/2021 | Akahane ........ | H03K 19/018521 |
| 2021/0184576 A1 | 6/2021 | Cattani et al. | |
| 2022/0109366 A1* | 4/2022 | Maejima ............... | H02M 1/007 |

FOREIGN PATENT DOCUMENTS

| | | | | |
|---|---|---|---|---|
| JP | 2010020481 A | * | 1/2010 | |
| JP | 2011-172309 A | | 9/2011 | |
| JP | 2011-223705 A | | 11/2011 | |
| JP | 2011244625 A | * | 12/2011 | |
| JP | 2013-191989 A | | 9/2013 | |
| JP | 2014-124025 A | | 7/2014 | |
| JP | 2017-208878 A | | 11/2017 | |
| WO | WO-2019064259 A1 | * | 4/2019 | .............. B60L 50/66 |

OTHER PUBLICATIONS

An Office Action; "Notice of Reasons for Refusal," mailed by the Japanese Patent Office on Jul. 30, 2024, which corresponds to Japanese Patent Application No. 2021-180384 and is related to U.S. Appl. No. 17/736,514; with English language translation.

* cited by examiner

SEMICONDUCTOR DEVICE

BACKGROUND OF THE INVENTION

Field

The present disclosure relates to a semiconductor device that generates a power supply voltage for a driving circuit that drives a switching device.

Background

In an inverter, a driving circuit that drives a switching device such as an IGBT is used. In a semiconductor device of relate art, a power supply voltage for an N-side driving circuit is generated by a transformer and a power supply voltage for a P-side driving circuit is generated by a bootstrap circuit (see, for example, Japanese Patent Laid-Open No. 2013-191989 (FIG. 1)).

SUMMARY

In the semiconductor device of the related art, since the transformer and the bootstrap diode are necessary, a mounting area on a substrate increases in size and cost increases.

The present disclosure has been made in order to solve the problems described above and an object of the present disclosure is to obtain a semiconductor device that can reduce the mounting area in size and reduce the cost.

A semiconductor device according to the present disclosure includes: a P-side driving circuit and an N-side driving circuit respectively driving a P-side switching device and an N-side switching device which are connected to configure a half bridge; and a N-side power supply generation circuit generating a power supply voltage for the N-side driving circuit from a power supply voltage for the P-side switching device.

In the present disclosure, the power supply generation circuit generates a power supply voltage for the N-side driving circuit from a power supply voltage for the P-side switching device. Accordingly, it is possible to generate the power supply voltage for the N-side driving circuit without using a transformer having a large area. Therefore, it is possible to reduce a mounting area and reduce cost.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
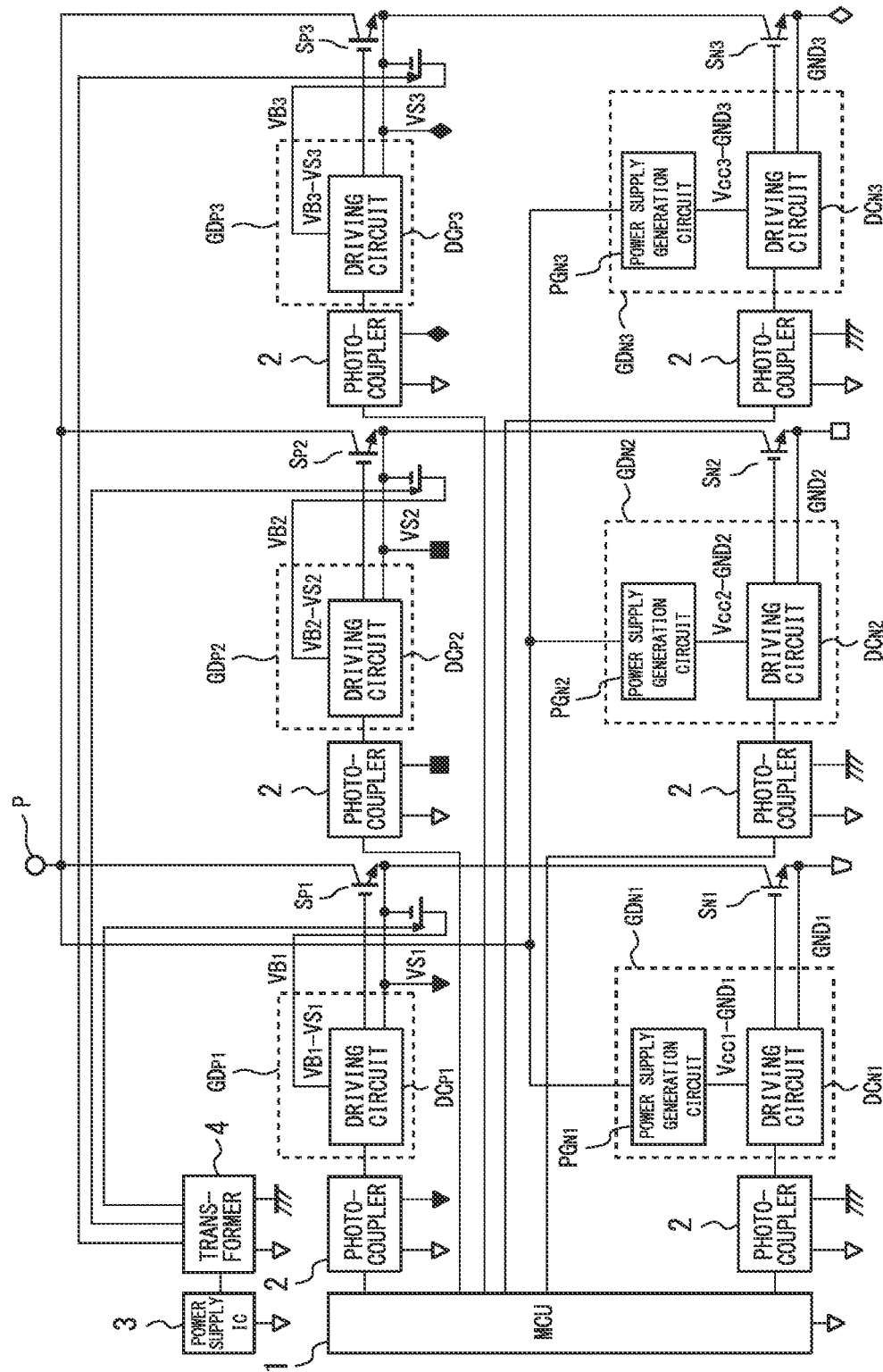
FIG. 1 is a diagram illustrating a semiconductor device according to a first embodiment.

FIG. 1 is a diagram illustrating a semiconductor device according to a first embodiment. The semiconductor device is a three-phase inverter. P-side switching devices $S_{P1}$, $S_{P2}$, and $S_{P3}$ and N-side switching devices $S_{N1}$, $S_{N2}$, and $S_{N3}$ are connected to configure a half bridge. That is, a collector of the P-side switching device $S_{P1}$ is connected to a P terminal, an emitter of the P-side switching device $S_{P1}$ and a collector of the N-side switching device $S_{N1}$ are connected to each other, and an emitter of the N-side switching device $S_{N1}$ is connected to the GND. The other switching devices are connected in the same manner. The P-side switching devices $S_{P1}$, $S_{P2}$, and Spa and the N-side switching devices $S_{N1}$, $S_{N2}$, and $S_{N3}$ are IGBTs (Insulated Gate Bipolar Transistors) but may be other power semiconductor elements such as MOS-FETs (Metal Oxide Semiconductor Field Effect Transistors). Note that "P side" means a high side of the half bridge and "N side" means a low side of the half bridge.

P-side driving circuits $DC_{P1}$, $DC_{P2}$, and $DC_{P3}$ respectively drive the P-side switching devices $S_{P1}$, $S_{P2}$, and $S_{P3}$. N-side driving circuits $DC_{N1}$, $DC_{N2}$, and $DC_{N3}$ respectively drive the N-side switching devices $S_{N1}$, $S_{N2}$, and $S_{N3}$. A memory control unit 1 sends control signals respectively to the P-side driving circuits $DC_{P1}$, $DC_{P2}$, and $DC_{P3}$ and the N-side driving circuits $DC_{N1}$, $DC_{N2}$, and $DC_{N3}$ via photocouplers 2. A P voltage applied to a P terminal is power supply voltages for the P-side switching devices $S_{P1}$, $S_{P2}$, and $S_{P3}$.

Since a voltage higher than the P voltage is necessary for gate driving for the P-side switching devices $S_{P1}$, $S_{P2}$, and $S_{P3}$, power supply voltages for the P-side driving circuits $DC_{P1}$, $DC_{P2}$, and $DC_{P3}$ cannot be generated from the P voltage. Therefore, a power supply IC 3 generates, with a transformer 4, the power supply voltages for the P-side driving circuits $DC_{P1}$, $DC_{P2}$, and $DC_{P3}$. The power supply voltage for the P-side driving circuit $DC_{P1}$ is a voltage $VB_1$-$VS_1$ based on an emitter voltage $VS_1$ of the P-side switching device $S_{P1}$. Similarly, the power supply voltage for the P-side driving circuit $DC_{P2}$ is a voltage $VB_2$-$VS_2$. The power supply voltage for the P-side driving circuit $DC_{P3}$ is a voltage $VB_3$-$VS_3$.

N-side power supply generation circuits $PG_{N1}$, $PG_{N2}$, and $PG_{N3}$ respectively generate power supply voltages for the N-side driving circuits $DC_{N1}$, $DC_{N2}$, and $DC_{N3}$ from the P voltage without using a transformer. The N-side driving circuit $DC_{N1}$ and the N-side power supply generation circuit $PG_{N1}$ are integrated in an N-side gate driver $GD_{N1}$ of the same chip or the same package. Similarly, the N-side driving circuit $DC_{N2}$ and the N-side power supply generation circuit $PG_{N2}$ are integrated in an N-side gate driver $GD_{N2}$. The N-side driving circuit $DC_{N3}$ and the N-side power supply generation circuit $PG_{N3}$ are integrated in an N-side gate driver $GD_{N3}$. The N-side gate drivers $GD_{N1}$, $GD_{N2}$, and $GD_{N3}$ are integrated circuits. Power supply generation circuits are not provided in the P-side gate drivers $GD_{P1}$, $GD_{P2}$, and $GD_{P3}$. The P-side driving circuits $DC_{P1}$, $DC_{P2}$, and $DC_{P3}$ are respectively provided in the P-side gate drivers $GD_{P1}$, $GD_{P2}$, and $GD_{P3}$.

The P-side switching devices $S_{P1}$, $S_{P2}$, and $S_{P3}$, the N-side switching devices $S_{N1}$, $S_{N2}$, and $S_{N3}$, the P-side gate drivers $GD_{P1}$, $GD_{P2}$, and $GD_{P3}$, the N-side gate drivers $GD_{N1}$, $GD_{N2}$, and $GD_{N3}$, an MCU 1, the power supply IC 3, the transformer 4, and the like are mounted on a substrate.

Figure 2:
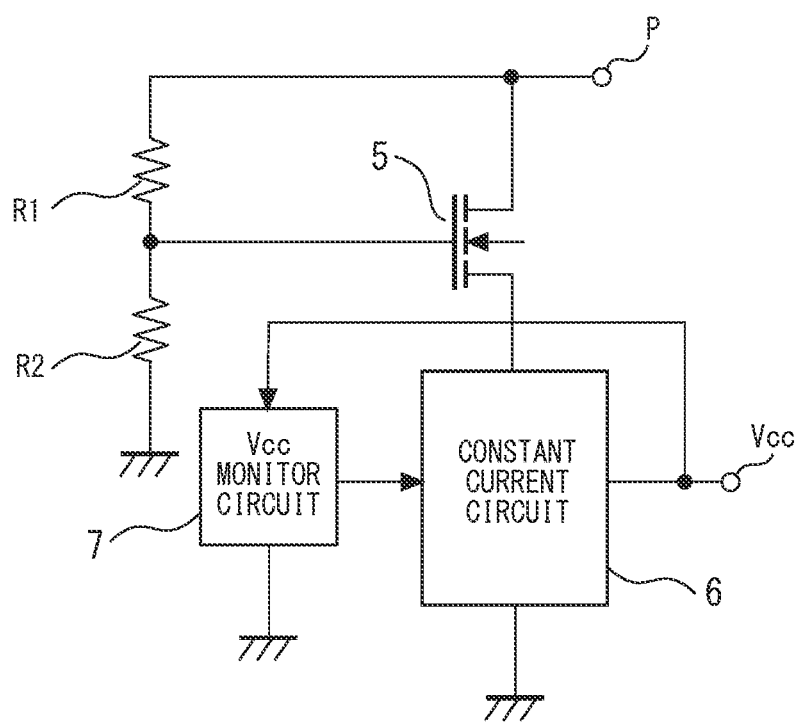
FIG. 2 is a diagram illustrating a configuration example of a power supply generation circuit.

FIG. 2 is a diagram illustrating a configuration example of a power supply generation circuit. The power supply generation circuit corresponds to the N-side power supply generation circuits $PG_{N1}$, $PG_{N2}$, and $PG_{N3}$. Resistors R1 and R2 are connected in series between a P terminal and a grounding point. A gate of a high withstand voltage NMOS 5 is connected to a connection point of the resistors R1 and R2, a drain of the high withstand voltage NMOS 5 is connected to the P terminal, and a source of the high withstand voltage NMOS 5 is connected to a constant current circuit 6. The constant current circuit 6 outputs an electric current to a Vcc terminal. The Vcc terminal is an output terminal of the power supply generation circuit. A Vcc monitor circuit 7 monitors a voltage value of the Vcc terminal and controls ON and OFF of the constant current circuit 6. In order to reduce heat generation of a gate driver, the high withstand voltage NMOS 5 may be externally attached without being incorporated in the gate driver.

When the P voltage is applied, a volage is applied to the gate of the high withstand voltage NMOS 5 and the high withstand voltage NMOS 5 is turned on. Consequently, an electric current flows from the P terminal to the drain and the source of the high withstand voltage NMOS 5. The electric current flows into the Vcc terminal via the constant current circuit 6. When a voltage at the Vcc terminal rises to a desired voltage, the Vcc monitor circuit 7 turns off the constant current circuit 6. Consequently, the voltage at the Vcc terminal is prevented from rising to exceed the desired voltage. When the voltage at the Vcc terminal drops, the Vcc monitor circuit 7 turns on the constant current circuit 6. In this way, the N-side power supply generation circuits $PG_{N1}$, $PG_{N2}$ and $PG_{N3}$ generate the power supply voltages for the N-side driving circuits $DC_{N1}$, $DC_{N2}$, and $DC_{N3}$ from the P voltage using the constant current circuit 6 without using a transformer.

As explained above, in this embodiment, the N-side power supply generation circuits $PG_{N1}$, $PG_{N2}$, and $PG_{N3}$ generate the power supply voltages for the N-side driving circuits $DC_{N1}$, $DC_{N2}$, and $DC_{N3}$ from the P voltage. Accordingly, it is possible to generate the power supply voltages for the N-side driving circuits $DC_{N1}$, $DC_{N2}$, and $DC_{N3}$ without using a transformer having a large area. As a result, it is possible to reduce the number of times of power supply generation by the transformer 4 from six to three. Therefore, it is possible to reduce a mounting area and reduce cost. The N-side driving circuits $DC_{N1}$, $DC_{N2}$, and $DC_{N3}$ and the N-side power supply generation circuits $PG_{N1}$, $PG_{N2}$, and $PG_{N3}$ can be respectively integrated into the same chips or the same packages. This is advantageous for a reduction in size. Note that the N-side power supply generation circuits $PG_{N1}$, $PG_{N2}$, and $PG_{N3}$ in the P-side gate drivers $GD_{P1}$, $GD_{P2}$, and $GD_{P3}$ can also generate a power supply voltage for the photocouplers 2 connected to the P-side gate drivers $GD_{P1}$, $GD_{P2}$, and $GD_{P3}$.

Second Embodiment

Figure 3:
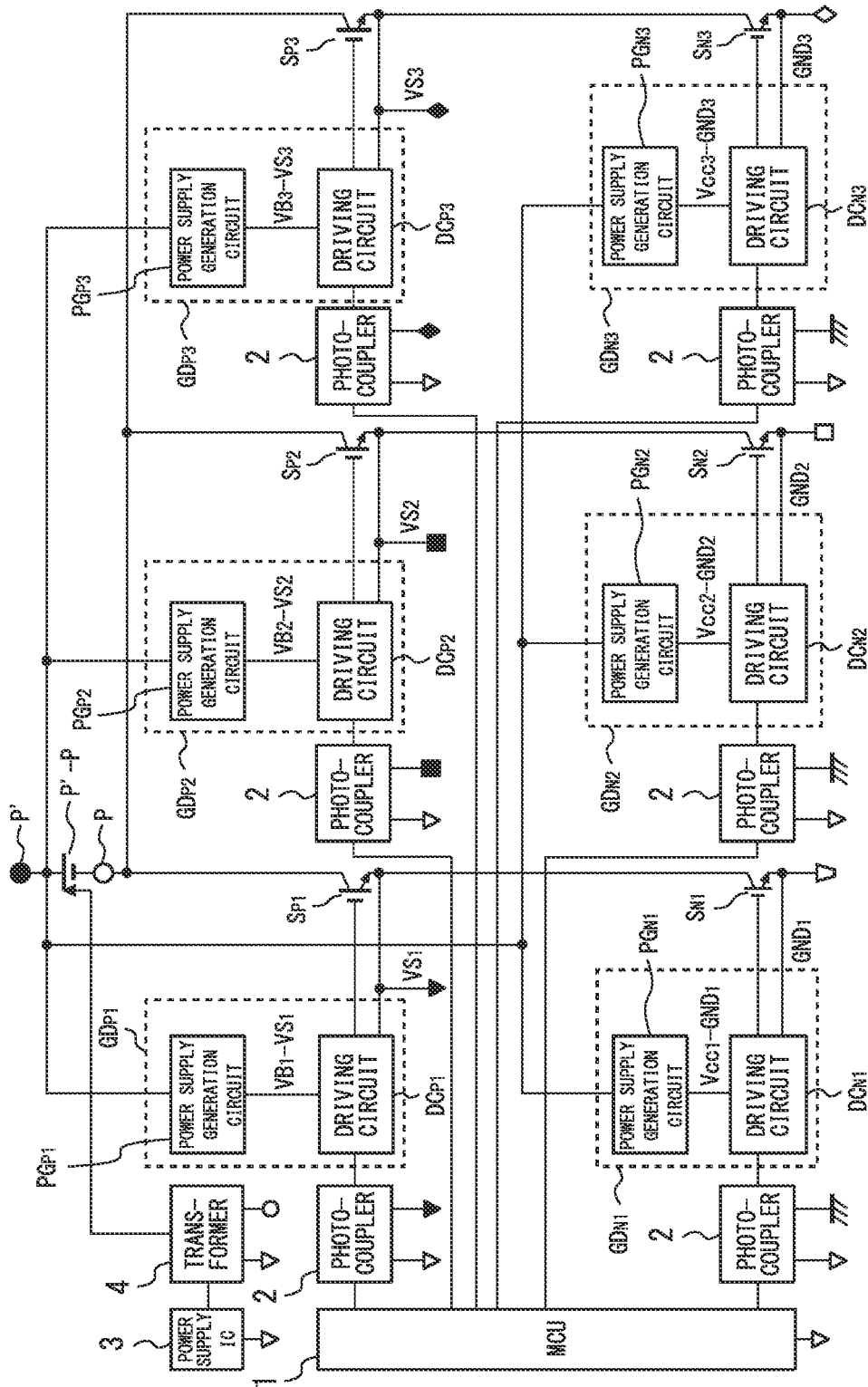
FIG. 3 is a diagram illustrating a semiconductor device according to a second embodiment.

FIG. 3 is a diagram illustrating a semiconductor device according to a second embodiment. In the first embodiment, the power supply voltages for the P-side driving circuits $DC_{P1}$, $DC_{P2}$, and $DC_{P3}$ are generated by the transformer 4. In contrast, in this embodiment, P-side power supply generation circuits $PG_{P1}$, $PG_{P2}$, and $PG_{P3}$ are respectively provided in the P-side gate drivers $GD_{P1}$, $GD_{P2}$, and $GD_{P3}$. The P-side power supply generation circuits $PG_{P1}$, $PG_{P2}$, and $PG_{P3}$ have the configuration illustrated in FIG. 2. The P-side power supply generation circuits $PG_{P1}$, $PG_{P2}$, and $PG_{P3}$ respectively generate the power supply voltages for the P-side driving circuits $DC_{P1}$, $DC_{P2}$, and $DC_{P3}$ using the constant current circuit 6 without using a transformer. The P-side driving circuit $DC_{P1}$ and the P-side power supply generation circuit $PG_{P1}$ are integrated in the P-side gate driver $GD_{P1}$ of the same chip or the same package. Similarly, the P-side driving circuit $DC_{P2}$ and the P-side power supply generation circuit $PG_{P2}$ are integrated in the P-side gate driver $GD_{P2}$. The P-side driving circuit $DC_{P3}$ and the P-side power supply generation circuit $PG_{P3}$ are integrated in the P-side gate driver $GD_{P3}$.

For gate driving of the P-side switching devices $S_{P1}$, $S_{P2}$, and $S_{P3}$, the P-side driving circuits $DC_{P1}$, $DC_{P2}$, and $DC_{P3}$ need a power supply voltage higher than the P voltage. Therefore, the power supply IC 3 generates, with the transformer 4, a P' voltage higher than the P voltage. The P-side power supply generation circuits $PG_{P1}$, $PG_{P2}$, and $PG_{P3}$ respectively generate power supply voltages for the P-side driving circuits $DC_{P1}$, $DC_{P2}$, and $DC_{P3}$ from the P' voltage. Consequently, whereas the number of times of power supply generation by the transformer 4 is three in the first embodiment, in this embodiment, the number of times of power supply generation by the transformer 4 can be reduced to one. Accordingly, it is possible to further reduce the mounting area and reduce the cost than in the first embodiment.

Third Embodiment

Figure 4:
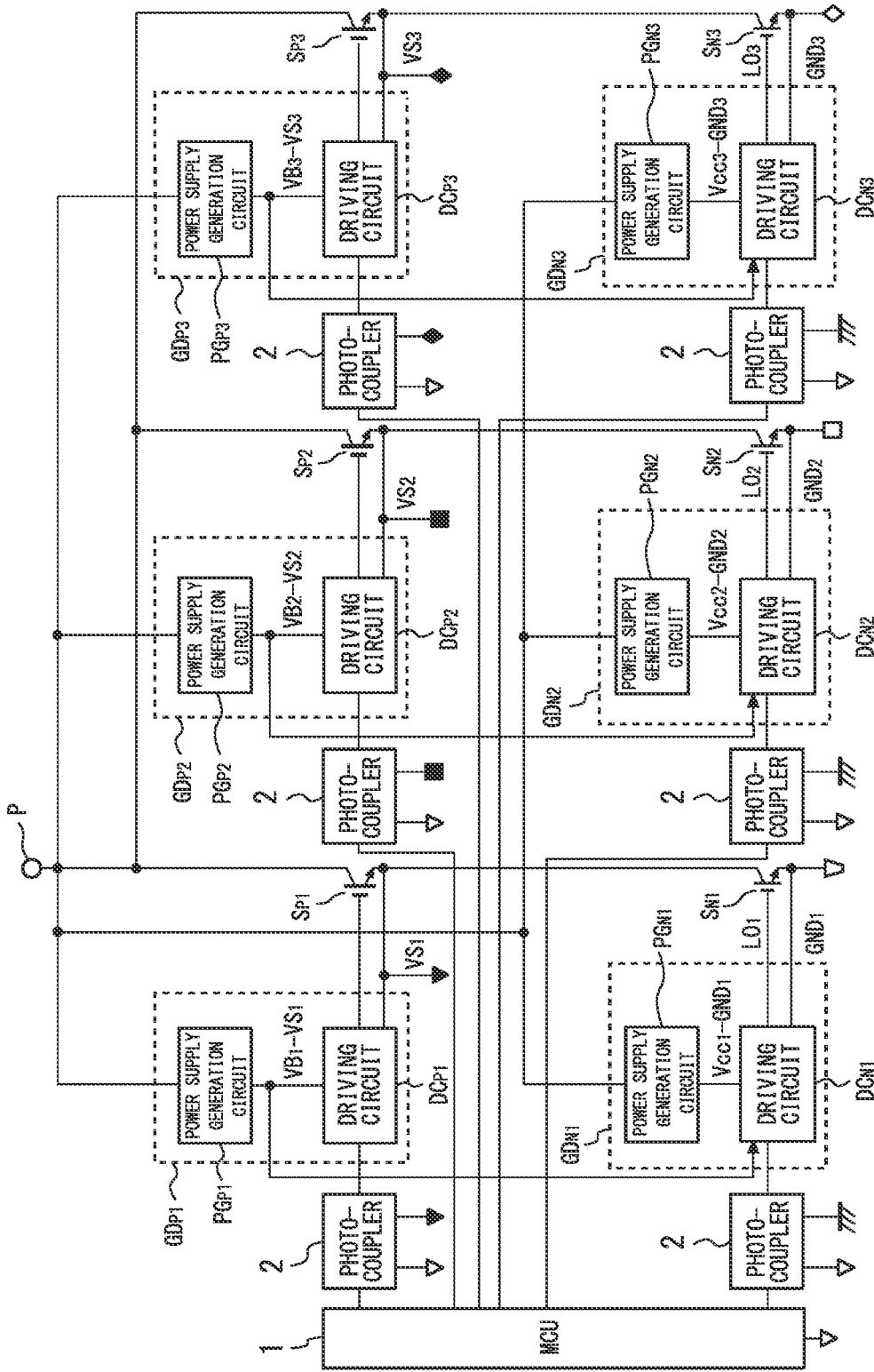
FIG. 4 is a diagram illustrating a semiconductor device according to a third embodiment.

FIG. 4 is a diagram illustrating a semiconductor device according to a third embodiment. In this embodiment, the P-side power supply generation circuits $PG_{P1}$, $PG_{P2}$, and $PG_{P3}$ are respectively provided in the P-side gate drivers $GD_{P1}$, $GD_{P2}$, and $GD_{P3}$. The P-side power supply generation circuits $PG_{P1}$, $PG_{P2}$, and $PG_{P3}$ generate power supply voltages for the P-side driving circuit $DC_{P1}$, $DC_{P2}$, and $DC_{P3}$ from the P voltage.

Figure 5:
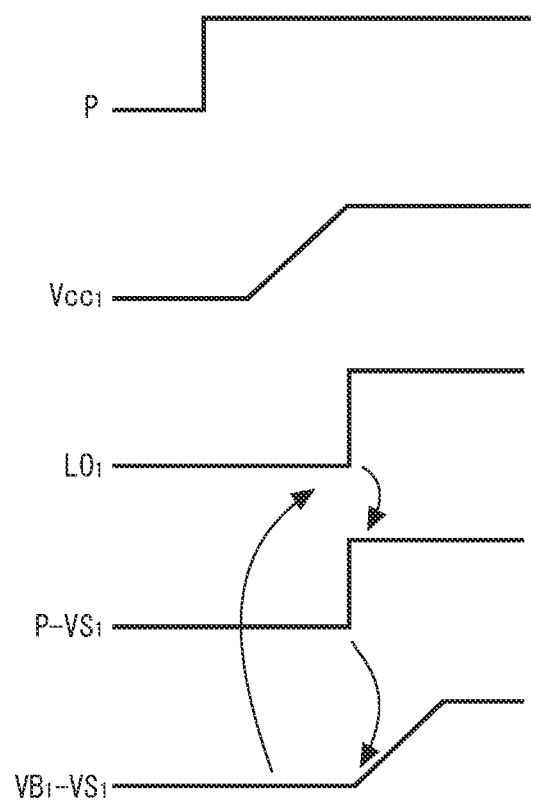
FIG. 5 is a time chart of voltages of the units of the semiconductor device according to the third embodiment.

FIG. 5 is a time chart of voltages of the units of the semiconductor device according to the third embodiment. P represents a voltage at the P terminal, $Vcc_1$ represents a power supply voltage for the N-side driving circuit $DC_{N1}$, $LO_1$ represents an output voltage of the N-side driving circuit $DC_{N1}$, $VS_1$ represents an emitter voltage of the P-side switching device $S_{P1}$, and $VB_1$-$VS_1$ represents a power supply voltage for the P-side driving circuit $DC_{P1}$.

For example, in the case of P-GND=600V and $VS_1$-GND=600V, when the $VB_1$-$VS_1$=15V is generated, $VB_1$-GND=615V. Therefore, P<$VB_1$ and the power supply voltage $VB_1$-$VS_1$ for the P-side driving circuit $DC_{P1}$ cannot be generated from the P voltage.

Therefore, in this embodiment, at an initial start time of the semiconductor device, after the N-side driving circuit $DC_{N1}$ changes the output voltage $LO_1$ to high to turn on the N-side switching device $S_{N1}$, the P-side power supply generation circuit $PG_{P1}$ generates the power supply voltage $VB_1$-$VS_1$ for the P-side driving circuit $DC_{P1}$.

When the N-side switching device $S_{N1}$ is turned on, $VS_1$-GND=0V. Therefore, since $VB_1$-GND=15V, P>$VB_1$. Accordingly, the P-side power supply generation circuit $PG_{P1}$ can generate the power supply voltage $VB_1$-$VS_1$ for the P-side driving circuit $DC_{P1}$ from the P voltage. Power supply voltages $VB_2$-$VS_2$ and $VB_3$-$VS_3$ for the P-side driving circuits $DC_{P2}$ and $DC_{P3}$ are generated by the same method.

Consequently, since power supply generation by a transformer is unnecessary, it is possible to further reduce the mounting area and reduce the cost than in the first embodiment. Note that, if the power supply voltages $VB_1$-$VS_1$, $VB_2$-$VS_2$, and $VB_3$-$VS_3$ for the P-side driving circuits $DC_{P1}$, $DC_{P2}$, and $DC_{P3}$ can be generated at the initial start time, thereafter, it is possible to cause the P-side driving circuits $DC_{P1}$, $DC_{P2}$, and $DC_{P3}$ to operate without hindering original ON and OFF operations of the switching devices.

Fourth Embodiment

Figure 6:
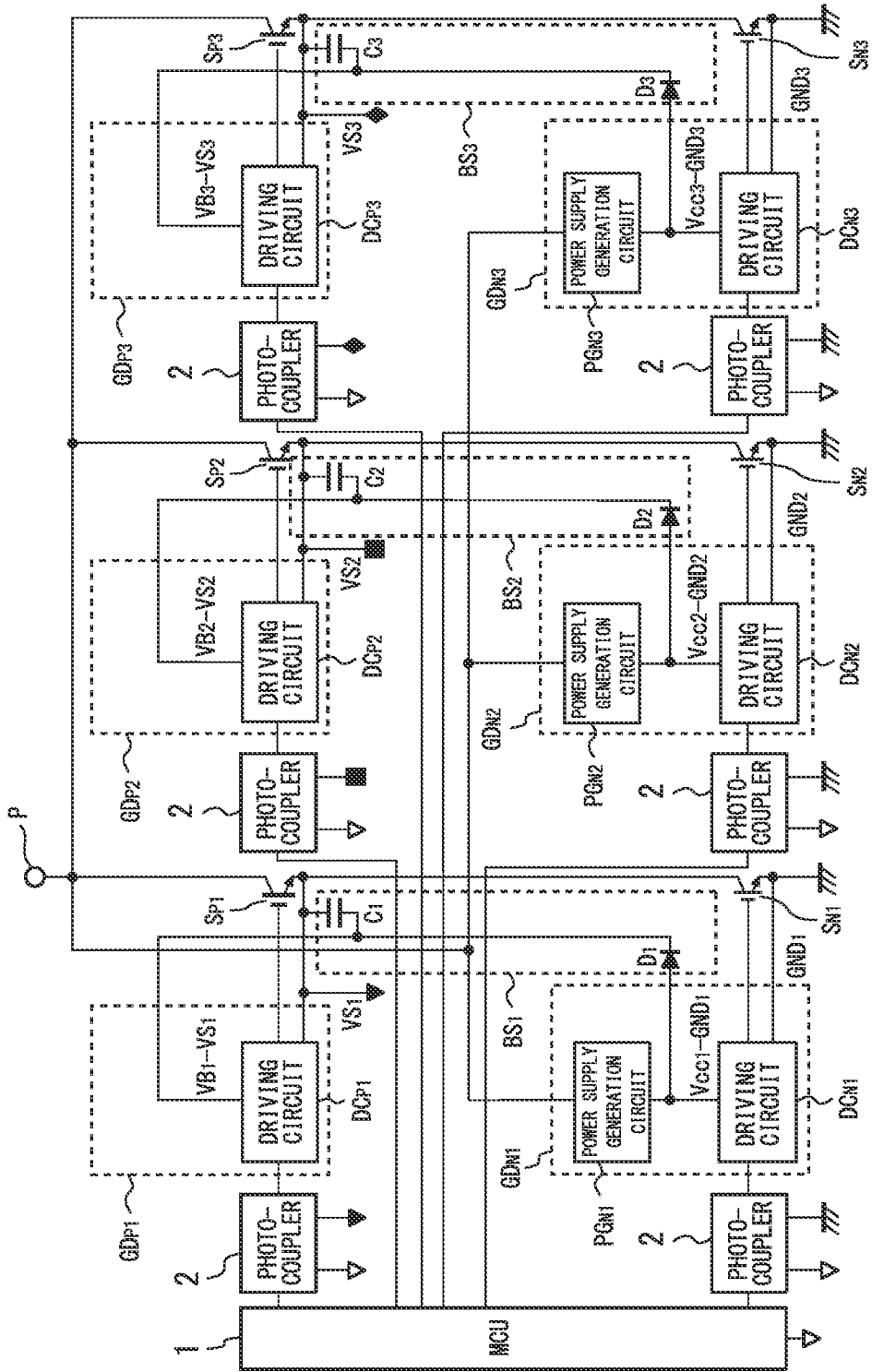
FIG. 6 is a diagram illustrating a semiconductor device according to a fourth embodiment.

FIG. 6 is a diagram illustrating a semiconductor device according to a fourth embodiment. As in the first embodiment, the N-side power supply generation circuits $PG_{N1}$, $PG_{N2}$, and $PG_{N3}$ are respectively provided in the N-side gate drivers $GD_{N1}$, $GD_{N2}$, and $GD_{N3}$ and respectively generate power supply voltages for the N-side driving circuits $DC_{N1}$, $DC_{N2}$, and $DC_{N3}$ from the P voltage. Whereas the N-side power supply generation circuits $PG_{N1}$, $PG_{N2}$, and $PG_{N3}$ generate, with the transformer 4, the power supply voltages for the P-side driving circuits $DC_{P1}$, $DC_{P2}$, and $DC_{P3}$ in the first embodiment, in this embodiment, bootstrap circuits $BS_1$, $BS_2$, and $BS_3$ respectively boost output voltages of the N-side power supply generation circuits $PG_{N1}$, $PG_{N2}$, and $PG_{N3}$ to generate power supply voltages for the P-side driving circuit $DC_{P1}$, $DC_{P2}$, and $DC_{P3}$. The bootstrap circuit $BS_1$ includes a bootstrap diode $D_1$ and a bootstrap capacitor $C_1$. An anode of the bootstrap diode $D_1$ is connected to an output terminal of the N-side power supply generation circuit $PG_{N1}$ and a cathode of the bootstrap diode $D_1$ is connected to a power supply terminal of the P-side driving circuit $DC_{P1}$. One end of the bootstrap capacitor $C_1$ is connected to an emitter of the P-side switching device $S_{P1}$ and the other end of the bootstrap capacitor $C_1$ is connected to a power supply terminal of the P-side driving circuit $DC_{P1}$. Similarly, the bootstrap circuit $BS_2$ includes a bootstrap diode $D_2$ and a bootstrap capacitor C2. The bootstrap circuit $BS_3$ includes a bootstrap diode $D_3$ and a bootstrap capacitor $C_3$.

In this embodiment, the N-side power supply generation circuits $PG_{N1}$, $PG_{N2}$, and $PG_{N3}$ generate the power supply voltages for the N-side driving circuits $DC_{N1}$, $DC_{N2}$, and $DC_{N3}$ from the P voltage. Therefore, a transformer for generating the power supply voltages for the N-side driving circuits $DC_{N1}$, $DC_{N2}$, and $DC_{N3}$ can be omitted. The bootstrap circuits $BS_1$, $BS_2$, and $BS_3$ respectively boost the output voltages of the N-side power supply generation circuits $PG_{N1}$, $PG_{N2}$, and $PG_{N3}$ to generate the power supply voltages for the P-side driving circuits $DC_{P1}$, $DC_{P2}$, and $DC_{P3}$. Therefore, the transformer 4 in the first embodiment can be omitted. A mounting area of the bootstrap circuits $BS_1$, $BS_2$, and $BS_3$ is smaller than a mounting area of the transformer 4. Accordingly, it is possible to further reduce the mounting area and reduce the cost than in the first embodiment.

Figure 7:
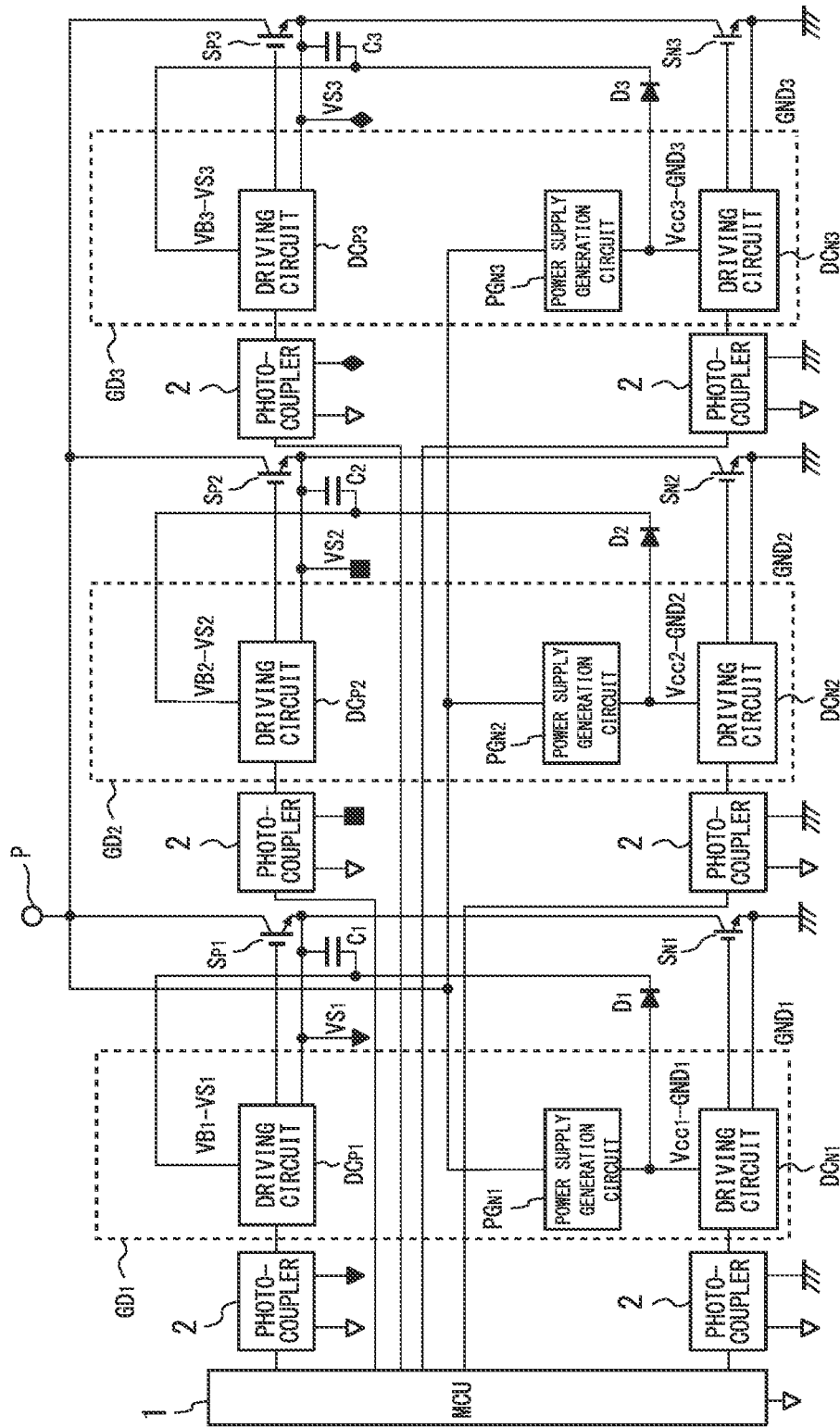
FIG. 7 is a diagram illustrating a modification 1 of the semiconductor device according to the fourth embodiment.

FIG. 7 is a diagram illustrating a modification 1 of the semiconductor device according to the fourth embodiment. The P-side driving circuit $DC_{P1}$ and the N-side driving circuit $DC_{N1}$ are formed on one chip to configure a gate driver $GD_1$. When the P-side driving circuit $DC_{P1}$ and the N-side driving circuit $DC_{N1}$ are formed on different chips, low-voltage internal power supplies that generate IC internal voltages from a power supply, power supply voltage drop protection circuits that detect a voltage drop of the power supply and interrupt a gate driving operation, and the like are necessary in the driving circuits. In contrast, by forming the P-side driving circuit $DC_{P1}$ and the N-side driving circuit $DC_{N1}$ on the one chip, a low voltage internal power supply, a power supply voltage drop protection circuit, and the like can be shared. Total chip cost can be reduced. Similarly, the P-side driving circuit $DC_{P2}$ and the N-side driving circuit $DC_{N2}$ configure a gate driver $GD_2$. The P-side driving circuit $DC_{P3}$ and the N-side driving circuit $DC_{N3}$ configure a gate driver $GD_3$. The gate drivers $GD_1$, $GD_2$, and $GD_3$ are HVICs (High Voltage ICs).

Figure 8:
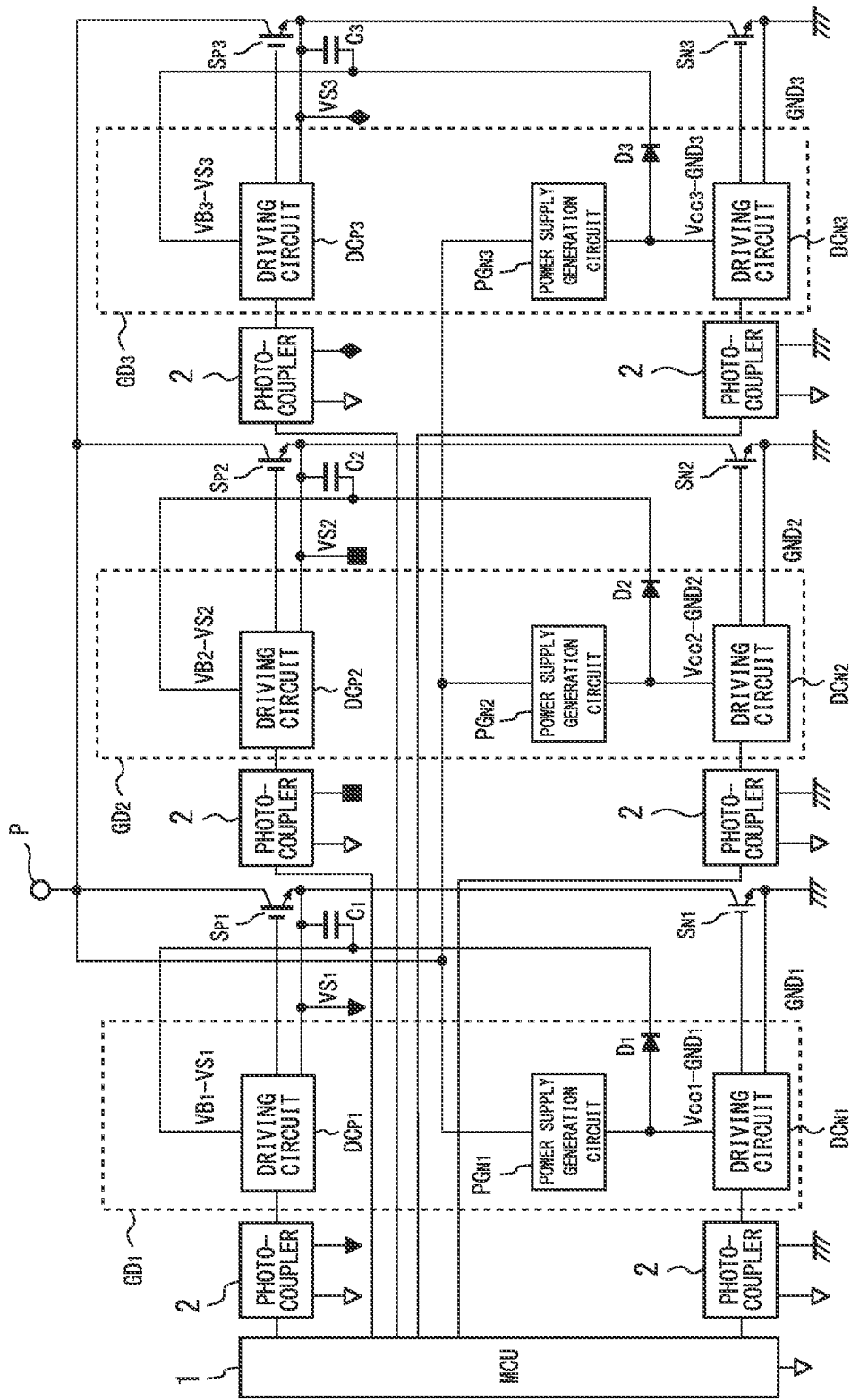
FIG. 8 is a diagram illustrating a modification 2 of the semiconductor device according to the fourth embodiment.

FIG. 8 is a diagram illustrating a modification 2 of the semiconductor device according to the fourth embodiment. The bootstrap diodes $D_1$, $D_2$, and $D_3$ are respectively incorporated in the gate drivers $GD_1$, $GD_2$, and $GD_3$. Consequently, it is possible to further reduce a substrate area. The P-side switching devices $S_{P1}$, $S_{P2}$, and $S_{P3}$ and N-side switching devices $S_{N1}$, $S_{N2}$, and $S_{N3}$ are not limited to devices formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-180384, filed on Nov. 4, 2021 including specification, claims, drawings and summary, on which the convention priority of the present application is based, is incorporated herein by reference in its entirety.

The invention claimed is:
1. A semiconductor device comprising:
 a P-side driving circuit and an N-side driving circuit respectively driving a P-side switching device and an N-side switching device which are connected to configure a half bridge;
 an N-side power supply generation circuit generating a power supply voltage for the N-side driving circuit from a power supply voltage for the P-side switching device;
 a transformer generating a voltage higher than the power supply voltage for the P-side switching device; and
 a P-side power supply generation circuit generating a power supply voltage for the P-side driving circuit from the voltage generated by the transformer.
2. The semiconductor device according to claim 1, wherein the power supply voltage for the P-side driving circuit is higher than the power supply voltage for the P-side switching device.

* * * * *